US007373833B2

(12) United States Patent
Hopper et al.

(10) Patent No.: US 7,373,833 B2

(45) **Date of Patent: *May 20, 2008**

(54) MEMS PRESSURE SENSING DEVICE

(75) Inventors: Peter J. Hopper, San Jose, CA (US); Michael Mian, Livermore, CA (US); James McGinty, East Kilbride (GB); Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/501,318

(22) Filed: Aug. 9, 2006

(65) Prior Publication Data

US 2006/0278009 A1 Dec. 14, 2006

Related U.S. Application Data

(62) Division of application No. 10/976,449, filed on Oct. 29, 2004, now Pat. No. 7,121,146.

(51) Int. Cl.
*G01L 9/00* (2006.01)

(52) U.S. Cl. ............................ 73/718; 73/724; 73/754

(58) Field of Classification Search .................. 73/718, 73/724, 753, 754
See application file for complete search history.

(56) References Cited

U.S. PATENT DOCUMENTS

| | | | | |
|---|---|---|---|---|
| 4,881,410 A | 11/1989 | Wise et al. | ................... | 73/724 |
| 4,996,627 A | 2/1991 | Zias et al. | ............... | 361/283.4 |
| 5,663,508 A | 9/1997 | Sparks | .................... | 73/861.71 |
| 5,963,788 A | 10/1999 | Barron et al. | ................. | 438/48 |
| 6,445,053 B1 | 9/2002 | Cho | ........................... | 257/417 |
| 6,472,243 B2 * | 10/2002 | Gogoi et al. | .................. | 438/50 |
| 6,968,743 B2 | 11/2005 | Rich et al. | .................... | 73/724 |
| 2004/0016995 A1 | 1/2004 | Kuo et al. | .................. | 257/678 |
| 2005/0208696 A1 | 9/2005 | Villa et al. | .................... | 438/53 |

* cited by examiner

*Primary Examiner*—Andre J. Allen
(74) *Attorney, Agent, or Firm*—Stallman & Pollock LLP

(57) ABSTRACT

A pressure sensing system formed in a monolithic semiconductor substrate. The pressure sensing system comprises a pressure sensing device formed on the monolithic semiconductor substrate. The pressure sensing device is adapted to be disposed in an environment for developing an electrical pressure signal corresponding to the pressure in the environment. The system includes driver circuitry formed in the monolithic semiconductor substrate. The driver circuitry is responsive to input electrical signal for generating an output pressure signal. A conductive interconnect structure formed in the monolithic semiconductor substrate to electrically connects the pressure sensing device to the driver circuitry such that electrical pressure signals developed by the pressure sensing device are provided as input electrical signals to the driver circuitry.

9 Claims, 2 Drawing Sheets

MEMS PRESSURE SENSING DEVICE

RELATED APPLICATION

This application is a divisional of U.S. application Ser. No. 10/976,449, filed Oct. 29, 2004, now U.S. Pat. No. 7,121,146 and this divisional patent application is related in subject matter to commonly-assigned U.S. application Ser. No. 10/977,169, filed Oct. 29, 2004, now U.S. Pat. No. 7,021,151. Both application Ser. No. 10/976,449 and U.S. Pat. No. 7,021,151 are hereby incorporated by reference in their entirety.

TECHNICAL FIELD

The present invention relates to Micro-Electro-Mechanical Systems (MEMS) and, in particular, to an integrated MEMS pressure sensor structure that is surface machined directly over the driving electronics, and to a method of making the MEMS pressure sensor structure.

DESCRIPTION OF THE INVENTION

Vehicles operated with underinflated tires pose a significant safety problem. A major contributor to the high rate of tire failure due to underinflation and gradual pressure loss is that many people do not know whether or not their vehicle's tires are properly inflated. The U.S. Congress has mandated that automobile manufacturers implement a tire pressure monitoring system by 2007 for automobiles operating in the U.S. This provides a huge new market for Micro-Electronic-Mechanical Systems (MEMS) pressure sensing devices.

Micro-Electronic-Mechanical Systems (MEMS) involve the integration of mechanical elements, sensors, actuators and electronics on a common silicon substrate through microfabrication technology. While the electronics of a MEMS device are fabricated using integrated circuit (IC) process sequences, the micromechnaical components are fabricated using compatible "micromachining" processes that selectively etch away parts of a silicon wafer or add new structural layers to the wafer to form the mechanical and electromechanical features of the device.

Historically, and as described in the literature, integrated MEMS pressure sensors have been based upon bulk micromachining and wafer bonding techniques, resulting in a standalone device that then has to be electrically, and often mechanically, bonded to the driver electronics. This due to the fact that, for atmospheric pressure sensors, a sealed reference chamber is needed into which a diaphragm deforms. The conventional process utilized to create this structure involves the following steps: a cavity is machined on one component, a membrane is machined on a second component, ant the two components are then bonded together such that the bonding process seals the cavity with the membrane.

The present invention provides a MEMS technique whereby the pressure sensor is surface machined directly on top of the driving electronics. The technique saves both the cost of bonding two wafers together and the effort of having to etch through the thickness of a wafer to form a membrane.

The advantage thus provided is that micromachining process is greatly simplified and, thus, so is the fabrication cost. Also, by direct integration, power loss mechanisms associated with the connection of the conventional standalone sensor are mitigated.

The features and advantages of the present invention will be more fully appreciated upon consideration of the following detailed description of the invention and the accompanying drawings that set forth an illustrative embodiment in which the principles of the invention are utilized.

The present invention provides a pressure sensing system that is formed in a monolithic semiconductor substrate.

Figure 6:
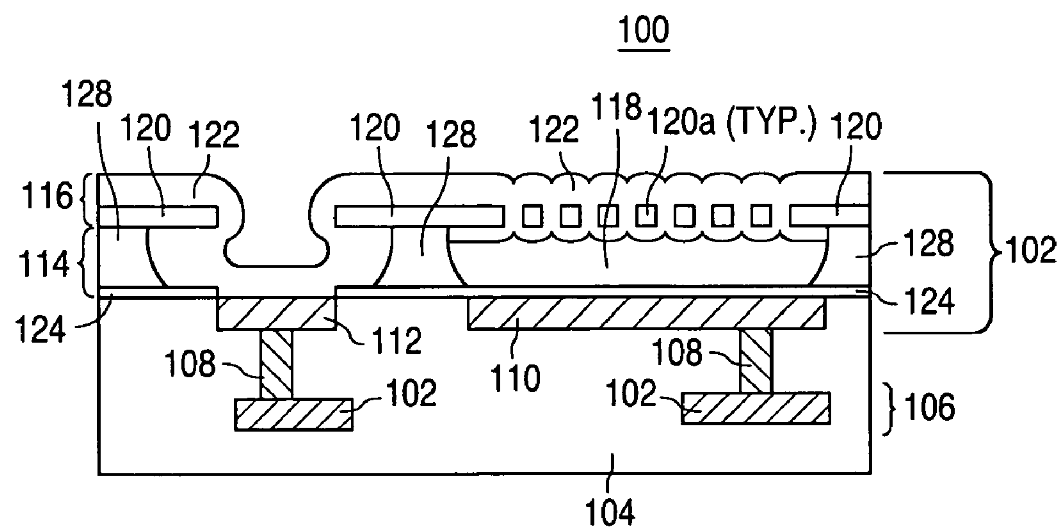

FIG. 6 shows an embodiment of a pressure sensing system 100 in accordance with the present invention. The pressure sensing system 100 comprises a pressure sensing device, generally designated by the numeral 102 in FIG. 6, that is formed on a monolithic semiconductor substrate 104. A more detailed description of an embodiment of a pressure sensing device 102 is described in greater detail below. The pressure sensing device 102 is adapted to be disposed in an environment for developing an electrical pressure signal that corresponds to the pressure in the environment. As further shown in FIG. 6, driver circuitry, generally designated by the numeral 106 in FIG. 6, is formed in the semiconductor substrate 104 below the pressure sensing device 102. The driver circuitry 106 may be conventional circuitry, well known to those skilled in the art, that responds to input electric signals by generating a corresponding output pressure signal. FIG. 6 also shows a conductive interconnect structure 108, which may also be conventional, that is formed in the semiconductor substrate 104 to electrically connect the pressure sensing device 102 and the driver circuitry 106 to provide electrical pressure signals developed by the pressure sensing device 102 as input electrical signals to the driver circuitry 106. The pressure sensing device 102 can comprise any micro-electro-mechanical system (MEMS) device, such as a capacitive pressure sensing device or a piezoelectric pressure sensing device.

The pressure sensing device 102 shown in FIG. 6 is a capacitive pressure sensing device that includes a conductive lower capacitor plate 110 formed at an upper surface of the semiconductor substrate 104. The lower capacitor plate 110 is electrically coupled to the driver circuitry 106 by conductive interconnect structure 108. A conductive pad 112 is also formed at the upper surface of the semiconductor substrate 104 and is spaced-apart from the lower capacitor plate 110. As shown in FIG. 6, the conductive pad 112 is also electrically coupled to the driver circuitry 106.

The capacitive pressure sensing device 102 further includes patterned dielectric material 114 that is formed over the upper surface of the semiconductor substrate 104. The patterned dielectric material 114 has a first opening formed therein to expose an upper surface of the conductive pad 112. The patterned dielectric material 114 also has a second opening formed therein over the lower capacitor plate 110.

An upper conductive layer 116 is formed over the patterned dielectric material 114. The upper conductive layer 116 extends into the first opening in the patterned dielectric material 114 to form electrical contact with the conductive pad 112. The upper conductive layer 116 also extends over the second opening in the patterned dielectric material 114 to define an enclosed pressure cavity 118 between the lower capacitor plate 110 and the upper conductive layer 116.

In the FIG. 6 embodiment, the upper conductive layer 116 comprises a supporting layer 120 of dielectric material formed on the patterned dielectric material 114. The supporting layer 120 has a first opening formed therein over the conductive pad 112. The supporting layer 120 also has a pattern of openings formed therein over the second opening in the patterned dielectric material 114. The upper conductive layer 116 in the FIG. 6 embodiment also includes an upper layer 122 of conductive material formed on the supporting layer 120 and extending through the first opening in the supporting layer 120 and into the first opening in the patterned dielectric material 114 to form electrical contact with the conductive pad 112. The upper layer 122 of conductive material also extends over and around the pattern of openings in the supporting layer 120 to close the openings to define the enclosed cavity 118 between the lower capacitor plate 110 and the upper conductive layer 116. The supporting layer 120 may comprise, for example, silicon nitride. The upper layer 122 of conductive material may comprise a metal, for example, aluminum or copper.

In the FIG. 6 embodiment, the patterned dielectric material 114 comprises a silicon nitride layer 124 having an opening formed therein to expose the upper surface of the conductive pad 112. The silicon nitride layer 124 also extends over the lower capacitor plate 110. In the FIG. 6 embodiment, the patterned dielectric material 114 further comprises a silicon oxide layer 126 formed on the silicon nitride layer 124. The silicon oxide layer 126 has a first opening formed therein to expose the upper surface of the conductive pad 112 and a second opening formed therein over the lower capacitor plate 110.

Referring to FIGS. 1-5, a method of fabricating a capacitive pressure sensing system in accordance with the concepts of the present invention will be described.

Figure 1:
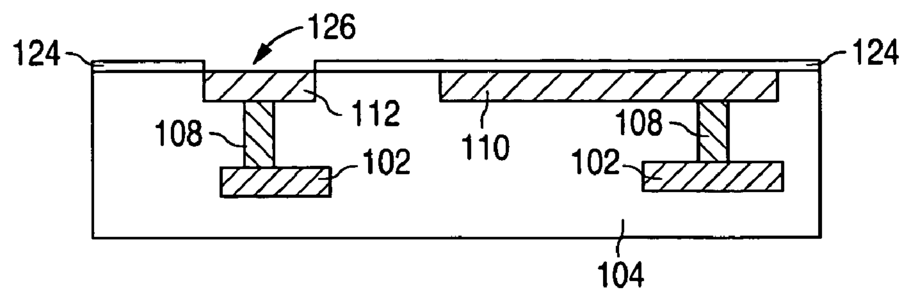
FIGS. 1-6 are partial cross-section drawings illustrating an embodiment of a sequence of steps for fabricating a MEMS pressure sensing device in accordance with the concepts of the present invention.

FIG. 1 shows a conductive lower capacitor plate 110 formed at an upper surface of a semiconductor substrate. As mentioned above, the lower capacitor plate 110 may be aluminum or copper or alloys thereof, or any other conductive material well known to those skilled in the art an utilized in integrated circuit capacitor structures. FIG. 1 also shows a conductive pad 112 formed at the upper surface of the semiconductor substrate 104 and spaced-apart from the lower capacitor plate 110. Those skilled in the art will appreciate that the lower capacitor plate 110 and the conductive pad 112 would typically be formed at the same time in the fabrication process from a common layer of conductive material. As shown in FIG. 1, both the lower capacitor plate 110 and the conductive pad 112 are conductively coupled to driver circuitry 106 formed in a crystalline silicon substrate 104. As further shown in FIG. 1, in the disclosed embodiment of the invention, a silicon nitride layer 124 is formed over the upper surface of the silicon substrate 104. The silicon nitride layer 124 has an opening 126 formed therein to expose the upper surface of conductive pad 112. Those skilled in the art will appreciate that the structure shown in FIG. 1 can be obtained utilizing a variety of photolithographic integrated circuit fabrication techniques well known to those skilled in the art.

Figure 2:
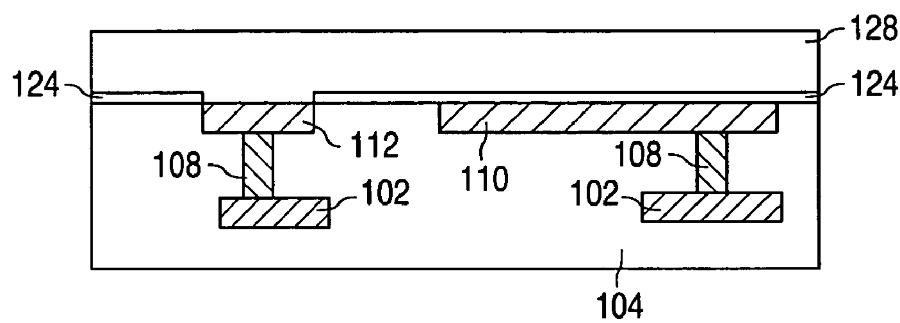
Figure 3:
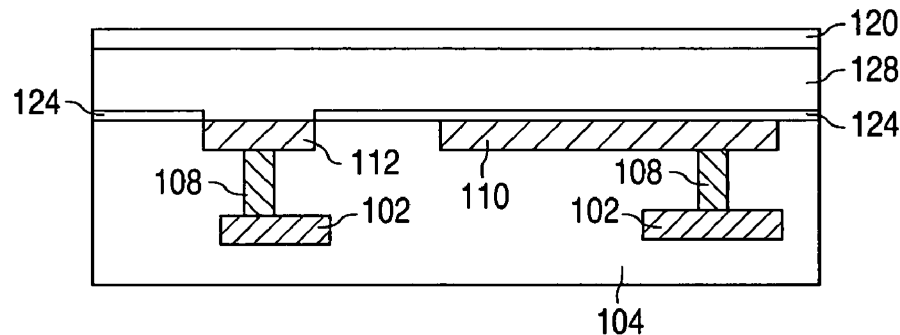
Figure 4:
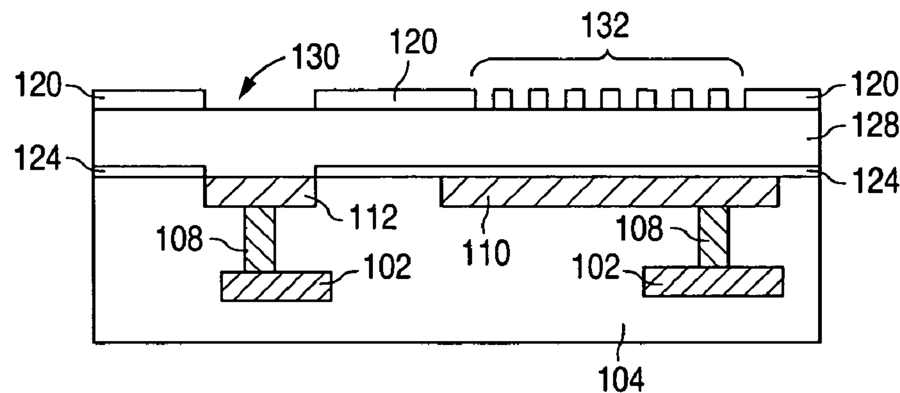
Figure 4A:
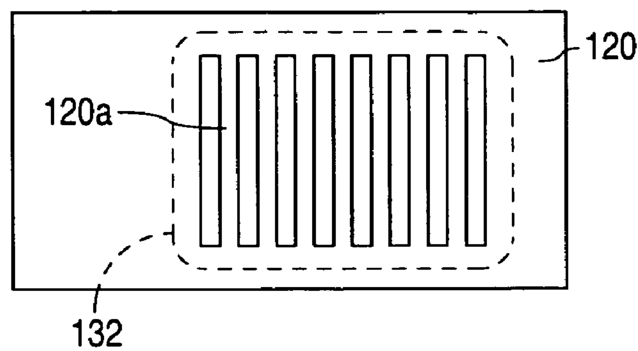

FIG. 2 shows that, following formation of the FIG. 1 structure, a layer 128 of low temperature oxide (LTO) is deposited over the silicon nitride layer 124. As shown in FIG. 3, in the disclosed embodiment, a supporting layer 120 of silicon nitride layer is then deposited on the low temperature oxide (LTO) layer 128. Referring to FIG. 4, the silicon nitride supporting layer 120 is then patterned to define a first opening 130 over the conductive pad 112 and a pattern of openings 132 formed over the lower capacitor plate 110. FIG. 4A shows one example of a pattern of openings 132 formed in the supporting silicon nitride layer 120. The pattern 132 shown in FIG. 4A includes a plurality of spaced-apart silicon nitride beams **120*a* that are supported at both ends by the silicon nitride 120. Those skilled in the art will appreciate that, while FIG. 4A illustrates a simple "grill" pattern of openings, any desired pattern of openings and in the silicon nitride layer 120** could be provided, e.g. a waffle pattern.

Figure 5:
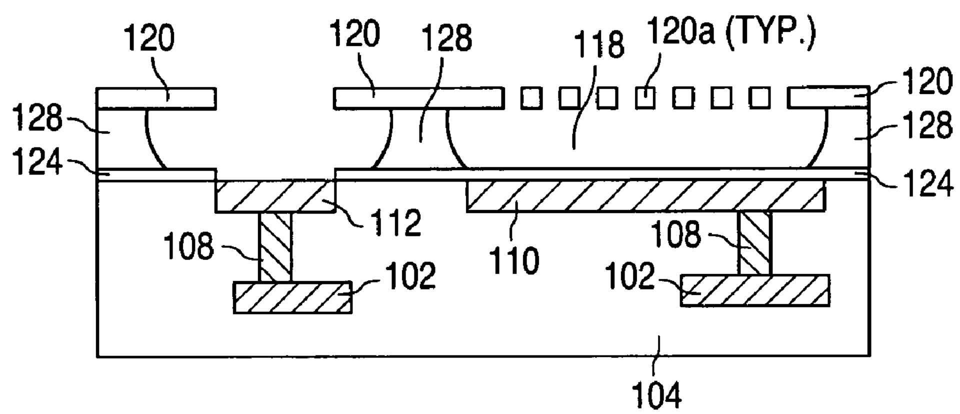

Referring to FIG. 5, a conventional anisotropic low temperature oxide (LTO) etch step is then performed to define a first opening 134 in the low temperature oxide (LTO) layer 128 to expose the upper surface of the conductive pad 112 and a second opening 136 over the lower capacitor plate 110. Note that, in the FIG. 5 embodiment, the LTO etch step stops on the nitride layer 124 over the lower capacitor plate 110.

FIG. 6 illustrates a plasma deposition step in which a metal conductive layer 122, e.g. aluminum or copper, is deposited on the silicon nitride supporting layer 120. The metal layer 122 is deposited to extend through the first opening in the supporting layer 120 and into the first opening in the patterned dielectric layer 114 to form electrical contact with the conductive pad 112. The deposited metal layer 122 also extends over the patterned openings **132*a* in its supporting layer 120 to close the opening and surround the openings 132*a* to define the enclosed cavity 118 between the lower capacitor plate 110 and the upper conductive layer 116. Those skilled in the art will appreciate that the pressure in the enclosed cavity following the plasma deposition of the metal layer 122** will be the same pressure as the pressure utilized in the plasma deposition process, typically about 30 mT.

As further shown in FIG. 6, during the plasma deposition step, a certain amount of the metal will fall through the openings **132*a* in the supporting nitride layer 120 and into the cavity 118. By biasing the lower capacitor plate 110 under the cavity 118 during the plasma deposition step, the amount of metal that falls into the cavity 118** can be reduced.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A pressure sensing system formed in a monolithic semiconductor substrate, the pressure sensing system comprising:

(a) driver circuitry formed in the monolithic semiconductor substrate, the driver circuitry being responsive to input electrical signals for generating an output pressure signal:

(b) a capacitive pressure sensing device formed on the semiconductor substrate, the capacitive pressure sensing device including (i) a conductive lower capacitor plate formed at an upper surface of the semiconductor substrate;

(ii) a conductive pad formed at the upper surface of the semiconductor substrate and spaced-apart from the lower capacitor plate;

(iii) patterned dielectric material formed over the upper surface of the semiconductor substrate and having a first opening formed therein to expose an upper surface of the conductive pad and having a second opening formed therein over the lower capacitor plate;

(iv) a supporting layer of dielectric material formed on the patterned dielectric material, the supporting layer having a first opening formed therein over the conductive pad and having a plurality of openings formed therein over the second opening in the patterned dielectric material; and (v) an upper layer of conductive material formed on the supporting layer and extending through the first opening in the supporting layer and into the first opening in the patterned dielectric material to form electrical contact with the exposed upper surface of the conductive pad, the upper layer of conductive material extending over the plurality of openings formed in the supporting layer to close said openings to define an enclosed cavity between the lower capacitor plate and the upper conductive layer; and (c) a conductive interconnect structure formed in the monolithic semiconductor substrate, the conductive interconnect structure being connected between the capacitive pressure sensing device and the driver circuitry for providing electrical pressure signals developed by the capacitive pressure sensing device as input electrical signals to the driver circuitry.

2. A pressure sensing system as in claim 1, and wherein the supporting layer comprises silicon nitride; and the upper layer of conductive material comprises a metal.

3. A pressure sensing system as in claim 2, and wherein the metal comprises aluminum.

4. A pressure sensing system as in claim 1, and wherein the semiconductor substrate comprises crystalline silicon.

5. A pressure sensing system as in claim 4, and wherein the patterned dielectric material comprises:

a silicon nitride layer having an opening formed therein to expose the upper surface of the conductive pad and that extends over the lower capacitor plate; and a silicon oxide layer formed on the silicon nitride layer and having a first opening formed therein to expose the upper surface of the conductive pad and a second opening formed therein over the lower capacitor plate.

6. A method of forming a pressure sensing system on a semiconductor substrate, the method comprising;

(a) forming a capacitive pressure sensing device in the monolithic semiconductor substrate, the capacitive pressure sensing device being adapted to be disposed in an environment for developing an electrical pressure signal corresponding to the pressure in the environment, the capacitive pressure sensing device including (i) a conductive lower capacitor plate formed at an upper surface of the semiconductor substrate;

(ii) a conductive pad formed at the upper surface of the semiconductor substrate and spaced-apart from the lower capacitor plate;

(iii) dielectric material formed over the upper surface of the semiconductor substrate, the lower capacitor plate and the conductive pad, the dielectric material being patterned to have a first opening formed therein to expose an upper surface of the conductive pad and to have a second opening formed therein over the lower capacitor plate;

(iv) a supporting layer of dielectric material formed on the patterned dielectric material, the supporting layer having a first opening formed therein over the conductive pad and having a plurality of openings formed therein over the second opening in the patterned dielectric material; and (v) an upper layer of conductive material formed on the supporting layer and extending through the first opening in the supporting layer and into the first opening in the patterned dielectric material to form electrical contact with the exposed upper surface of the conductive pad, the upper layer of conductive material extending over the plurality of openings in the supporting layer to close said openings to define an enclosed cavity between the lower capacitor plate and the upper conductive layer;

(b) forming driver circuitry in the monolithic semiconductor substrate, the driver circuitry being responsive to input electrical signals for generating an output pressure signal; and (c) forming a conductive interconnect structure in the monolithic semiconductor substrate, the conductive interconnect structure being connected between the capacitive pressure sensing device and the driver circuitry for providing electrical pressure signals developed by the pressure sensing device as input electrical signals to the driver circuitry.

7. A method as in claim 6, and wherein the upper layer of conductive material comprises aluminum.

8. A method as in claim 6, and wherein the semiconductor substrate comprises crystalline silicon.

9. A method as in claim 6, and wherein the patterned dielectric material comprises:

a silicon nitride layer formed over the upper surface of the semiconductor substrate, the conductive pad and the lower capacitor plate;

an opening formed in the silicon nitride layer to expose the upper surface of the conductive pad; and a silicon oxide layer formed over the silicon nitride layer, the silicon oxide layer being patterned to form a first opening therein to expose the upper surface of the conductive pad and to form a second opening therein over the lower capacitor plate.

* * * * *